(12) United States Patent
Yu et al.

(10) Patent No.: US 10,867,958 B2
(45) Date of Patent: Dec. 15, 2020

(54) INTEGRATED CIRCUIT WITH A THERMALLY CONDUCTIVE UNDERFILL

(71) Applicant: Taiwan Semiconductor Manufacturing Company, Ltd., Hsinchu (TW)

(72) Inventors: Chen-Hua Yu, Hsinchu (TW); Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/390,159

(22) Filed: Apr. 22, 2019

(65) Prior Publication Data
US 2019/0252346 A1 Aug. 15, 2019

Related U.S. Application Data

(60) Division of application No. 14/989,181, filed on Jan. 6, 2016, now Pat. No. 10,269,757, which is a
(Continued)

(51) Int. Cl.
*H01L 23/48* (2006.01)
*H01L 23/52* (2006.01)
(Continued)

(52) U.S. Cl.
CPC ............ *H01L 24/81* (2013.01); *H01L 21/563* (2013.01); *H01L 24/06* (2013.01); *H01L 24/16* (2013.01); *H01L 24/17* (2013.01); *H01L 24/29* (2013.01); *H01L 24/32* (2013.01); *H01L 24/73* (2013.01); *H01L 24/83* (2013.01); *H01L 24/92* (2013.01);
(Continued)

(58) Field of Classification Search
CPC ....... H01L 21/563; H01L 24/06; H01L 24/16; H01L 24/17; H01L 24/29; H01L 24/32; H01L 24/73; H01L 24/83; H01L 24/92; H01L 25/0657; H01L 24/81; H01L 2224/16225; H01L 2224/17181; H01L 2224/16227; H01L 2224/16145; H01L 2224/1601; H01L 2224/131; H01L 2224/83104; H01L 2224/92; H01L 2224/83855; H01L 2224/8192; H01L 24/33; H01L 2224/33181; H01L 2224/32225; H01L 2224/32145; H01L 2224/2919; H01L 24/13; H01L 2224/831;
(Continued)

(56) References Cited

U.S. PATENT DOCUMENTS

2008/0039560 A1\* 2/2008 Mills .................... C08J 3/005
524/183
2008/0119014 A1 5/2008 Hooi
(Continued)

*Primary Examiner* — Kimberly N Rizkallah
*Assistant Examiner* — Dilinh P Nguyen
(74) *Attorney, Agent, or Firm* — Slater Matsil, LLP

(57) ABSTRACT

An integrated circuit includes a substrate and at least one chip. Each chip is disposed over the substrate or the other chip. Solder bumps are disposed between the substrate and the at least one chip. An insulating film is disposed around the solder bumps and provides electrical insulation for the solder bumps except areas for interconnections. A thermally conductive underfill is disposed between the substrate, the at least one chip, and the solder bumps.

20 Claims, 1 Drawing Sheet

Related U.S. Application Data continuation of application No. 13/628,564, filed on Sep. 27, 2012, now Pat. No. 9,236,277.

(60) Provisional application No. 61/681,941, filed on Aug. 10, 2012.

(51) Int. Cl.
*H01L 29/40* (2006.01)
*H01L 23/00* (2006.01)
*H01L 25/065* (2006.01)
*H01L 21/56* (2006.01)

(52) U.S. Cl.
CPC .......... *H01L 25/0657* (2013.01); *H01L 24/13* (2013.01); *H01L 24/33* (2013.01); *H01L 2224/131* (2013.01); *H01L 2224/1601* (2013.01); *H01L 2224/16145* (2013.01); *H01L 2224/16225* (2013.01); *H01L 2224/16227* (2013.01); *H01L 2224/17181* (2013.01); *H01L 2224/2919* (2013.01); *H01L 2224/32145* (2013.01); *H01L 2224/32225* (2013.01); *H01L 2224/33181* (2013.01); *H01L 2224/73204* (2013.01); *H01L 2224/8192* (2013.01); *H01L 2224/831* (2013.01); *H01L 2224/83104* (2013.01); *H01L 2224/83855* (2013.01); *H01L 2224/92* (2013.01); *H01L 2225/06513* (2013.01); *H01L 2225/06517* (2013.01); *H01L 2225/06589* (2013.01)

(58) Field of Classification Search
CPC . H01L 2225/06517; H01L 2225/06589; H01L 2225/06513; H01L 2224/73204
USPC .......................... 257/773, 778, 782–783, 786
See application file for complete search history.

(56) References Cited

U.S. PATENT DOCUMENTS

| | | |
|---|---|---|
| 2009/0273073 A1 | 11/2009 | Tachibana et al. |
| 2010/0072601 A1* | 3/2010 | Tanaka ............... H01L 23/13 257/686 |
| 2010/0264552 A1 | 10/2010 | Nakasato et al. |
| 2010/0276803 A1 | 11/2010 | Higuchi et al. |
| 2011/0186998 A1 | 8/2011 | Wu et al. |
| 2011/0309481 A1* | 12/2011 | Huang ............... H01L 21/563 257/659 |
| 2012/0098123 A1 | 4/2012 | Yu et al. |
| 2012/0104602 A1* | 5/2012 | Nanba ............... H01L 24/11 257/737 |
| 2012/0187583 A1 | 7/2012 | Karpur et al. |
| 2012/0280404 A1 | 11/2012 | Kwon |
| 2012/0282739 A1 | 11/2012 | Brunschwiler et al. |

* cited by examiner

INTEGRATED CIRCUIT WITH A THERMALLY CONDUCTIVE UNDERFILL

PRIORITY

This application is a divisional of U.S. patent application Ser. No. 14/989,181, filed Jan. 6, 2016, entitled "Integrated Circuit with a Thermally Conductive Underfill and Methods of Forming Same," which is a continuation of U.S. patent application Ser. No. 13/628,564, filed Sep. 27, 2012, (now U.S. Pat. No. 9,236,277, issued Jan. 12, 2016) entitled "Integrated Circuit with a Thermally Conductive Underfill and Methods of Forming Same," which claims priority to U.S. Provisional Patent Application Ser. No. 61/681,941, filed Aug. 10, 2012, which applications are incorporated herein by reference.

TECHNICAL FIELD

The present disclosure relates generally to an integrated circuit and more particularly to a bump underfill.

BACKGROUND

For flip-chip bonding or 3D chip stacking, underfill material is used to fill up the gap between chips and/or a chip and a substrate/printed circuit board (PCB). However, some flip-chips or 3D chips suffer degradation or damage from high temperature due to accumulated heat arising from poor thermal conductivity through the underfill material that hinders cooling of the chips.

BRIEF DESCRIPTION OF THE DRAWINGS

Reference is now made to the following descriptions taken in conjunction with the accompanying drawings, in which.

DETAILED DESCRIPTION

Figure 1:
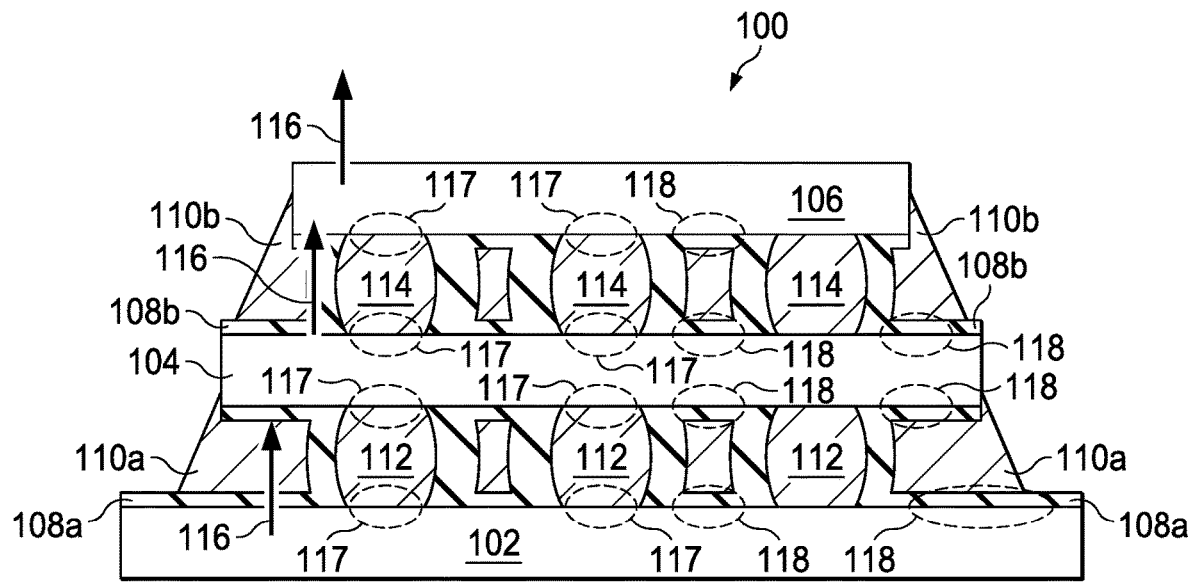
FIG. 1 is a schematic diagram of an exemplary integrated circuit underfill structure according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary integrated circuit underfill structure according to some embodiments. An integrated circuit 100 includes a substrate 102 and (integrated circuit) chips 104 and 106. The substrate 102 can be a silicon substrate (or any other suitable material), another integrated circuit chip, or a printed circuit board (PCB). The substrate 102 and/or chips 104 and 106 may include electrical devices or components fabricated on the surface, e.g., transistors, resistors, capacitors, etc. in some embodiments. The chip 104 can be an interposer in some embodiments.

The chip 104 is disposed over the substrate 102 and the chip 106 is disposed over the chip 104. Even though two chips 104 and 106 are shown over the substrate 102, there can be one chip, three or more chips over the substrate 102 stacked vertically. The substrate 102 and the chips 104 and 106 can be flip-chip bonded, 2.5D die-stacked, 3D die-stacked, or combined by any other methods. Solder bumps 112 and 114 are disposed between the substrate 102 and the chips 104 and 106, and provide interconnections. The solder bumps 112 and 114 can be micro solder bumps or ball grid array (BGA) solder bumps, for example, and have diameter/heights ranging from 10 µm to 800 µmin some embodiments.

Insulating films 108a and 108b are disposed around the solder bumps 112 and 114 respectively. The insulating films 108a and 108b provide electrical insulation for the solder bumps 112 and 114 except areas for interconnections such as 117. In some embodiments, the insulating films 108a and 108b cover some chip areas such as 118 between the solder bumps 112 or 114. In some embodiments, the substrate 102 and chips 104 and 106 may also have passivation or dielectric layers on the surfaces (not shown) for electrical insulation, such as silicon nitride or silicon dioxide.

The insulating films 108a and 108b are conformal to the solder bumps 112 and 114 (i.e. they maintain the general shape of the underlying topography, by having a uniform thickness), and have a thickness ranging from 500 angstrom to 20 µm some embodiments. The insulating films 108a and 108b are formed (or coated) by atomic layer deposition or chemical vapor deposition, for example. The insulating films 108a and 108b comprise silicon dioxide, hafnium oxide, titanium oxide, zirconium oxide, polymer, aluminum oxide, other metal oxide, any combination thereof, or any other suitable material.

Thermally conductive underfill 110a and 110b, disposed between the substrate 102, the chips 104 and 106, and the solder bumps 112 and 114, provide protection and mechanical strength for the integrated circuit 100. Also, the underfill 110a and 110b compensate for any thermal expansion difference between the substrate 102 and chips 104 and 106. The underfill 110a and 110b are formed by dispensing and curing the underfill and the dispensing is performed by needle dispensing or jet dispensing in some embodiments.

The underfill 110a and 110b have a thermal conductivity of at least 0.5 W/mK in some embodiments for good heat conductivity. Heat dissipation is indicated by arrows 116, for example. In some embodiments, the underfill 110a and 110b comprise polymer such as commercially available Epo-TEK T7109 epoxy, which has a thermal conductivity of about 1.5 W/mK and an electrical resistivity of about $10^{13}$ ohm-cm. This provides a better thermal conductivity compared to some other material such as commercially available LOC-TITE epoxy, which has a thermal conductivity of about 0.2 W/mK and an electrical resistivity of about $10^{16}$ ohm-cm. As a result, the integrated circuit 100 has improved thermal conductivity between the substrate 102 and stacked chips 104 and 106.

Figure 2:
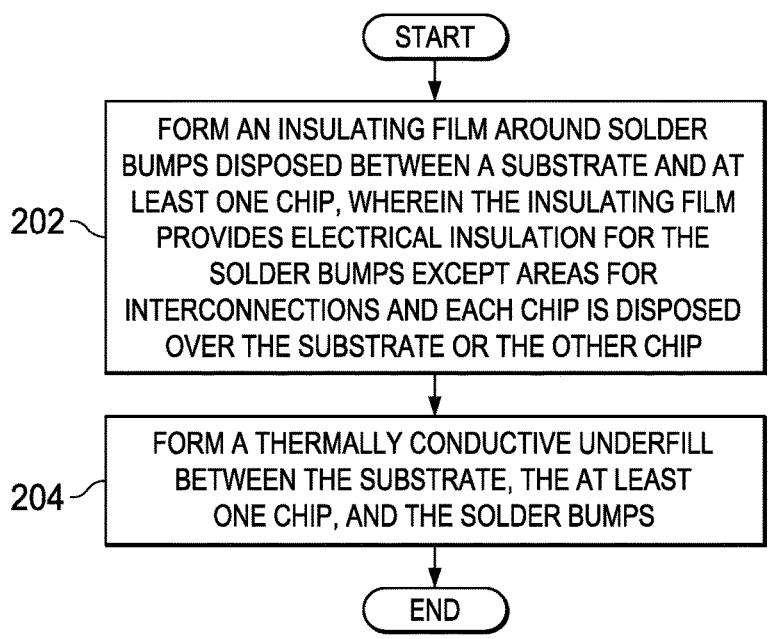
FIG. 2 is a flowchart of a method of fabricating the exemplary integrated circuit underfill structure in FIG. 1 according to some embodiments.

FIG. 2 is a flowchart of a method of fabricating the exemplary integrated circuit underfill structure in FIG. 1 according to some embodiments. At step 202, an insulating film is formed around solder bumps disposed between a substrate and at least one chip. The insulating film provides electrical insulation for the solder bumps except areas for interconnections. Each chip is disposed over the substrate or the other chip. The insulating film is formed (or coated) by atomic layer deposition or chemical vapor deposition, for example.

The insulating film is conformal to the solder bumps and has a thickness ranging from 500 angstrom to 20 µm in some embodiments. The insulating film comprises silicon dioxide, hafnium oxide, titanium oxide, zirconium oxide, polymer, aluminum oxide, other metal oxide, any combination thereof, or any other suitable material. The insulating film is formed to cover chip areas between the solder bumps in some embodiments.

At step 204, a thermally conductive underfill is formed between the substrate, the at least one chip, and the solder bumps. The thermally conductive underfill has a thermal conductivity of at least 0.5 W/mK in some embodiments for better heat conductivity. The thermally conductive underfill comprises polymer. In some embodiments, the underfill comprises commercially available Epo-TEK T7109 epoxy, which has a thermal conductivity of about 1.5 W/mK and an electrical resistivity of about $10^{13}$ ohm-cm. The underfill is formed by dispensing and curing the underfill, and the dispensing is performed by needle dispensing or jet dispensing in some embodiments.

According to some embodiments, an integrated circuit includes a substrate and at least one chip. Each chip is disposed over the substrate or the other chip. Solder bumps are disposed between the substrate and the at least one chip. An insulating film is disposed around the solder bumps and provides electrical insulation for the solder bumps except areas for interconnections. A thermally conductive underfill is disposed between the substrate, the at least one chip, and the solder bumps.

According to some embodiments, a method includes forming an insulating film around solder bumps disposed between a substrate and at least one chip. Each chip is disposed over the substrate or the other chip. The insulating film provides electrical insulation for the solder bumps except areas for interconnections. A thermally conductive underfill is formed between the substrate, the at least one chip, and the solder bumps.

According to some embodiments, an integrated circuit includes a substrate and at least one chip. Each chip is disposed over the substrate or the other chip. Solder bumps are disposed between the substrate and the at least one chip and provide interconnections. An insulating film is disposed around the solder bumps. The insulating film provides electrical insulation for the solder bumps except the interconnections provided by the solder bumps. A thermally conductive underfill is disposed between the substrate, the at least one chip, and the solder bumps. The thermally conductive underfill comprises polymer having a thermal conductivity of at least 0.5 W/mK.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A device comprising:
    a first set of solder bumps bonding a first surface of a substrate to a second surface of a first chip;
    a first insulating film contacting the first set of solder bumps, the second surface of the first chip, and the first surface of the substrate, the first insulating film extending along the first surface of the substrate and the second surface of the first chip from a first solder bump of the first set of solder bumps to a second solder bump of the first set of solder bumps; and
    a first thermally conductive underfill disposed between the substrate and the first chip, the first thermally conductive underfill being disposed between the first solder bump and the second solder bump, the first insulting film completely separating the first thermally conductive underfill from the first surface of the substrate and the second surface of the first chip.

2. The device of claim 1, wherein the first thermally conductive underfill has a thermal conductivity of at least 0.5 W/mK.

3. The device of claim 1, wherein the first insulating film has a uniform thickness on sidewalls of the first set of solder bumps as measured from the sidewalls of the first set of solder bumps in a direction perpendicular to the sidewalls of the first set of solder bumps.

4. The device of claim 3, wherein the uniform thickness is from 500 Å to 20 µm.

5. The device of claim 1 further comprising:
    a second set of solder bumps bonding a second chip to the first chip, the first chip being between the second chip and the substrate;
    a second insulating film contacting the second set of solder bumps, with a first surface of the first chip, and a surface of the second chip; and
    a second thermally conductive underfill disposed between the first chip and the second chip, the second thermally conductive underfill being disposed between solder bumps of the second set of solder bumps.

6. The device of claim 1, wherein the first thermally conductive underfill comprises a polymer.

7. The device of claim 1, wherein the first insulating film comprises aluminum oxide, hafnium oxide, silicon dioxide, titanium oxide, zirconium oxide, a polymer, or any combination thereof.

8. A device comprising:
a first device;
a second device bonded to the first device through a first plurality of solder bumps;
a first insulating film extending along and physically contacting a first surface of the first device from a first solder bump of the first plurality of solder bumps to a second solder bump of the first plurality of solder bumps, the first insulating film extending along and physically contacting a second surface of the second device from the first solder bump to the second solder bump; and
a first underfill material disposed between the first device and the second device, the first underfill material extending from the first insulating film on the first solder bump to the first insulating film on the second solder bump, the first underfill material being completely separated from the first surface of the first device and the second surface of the second device by the first insulating film.

9. The device of claim 8, wherein the first underfill material comprises a thermally conductive material.

10. The device of claim 9, wherein the first underfill material has a thermal conductivity of at least 0.5 W/mK.

11. The device of claim 10, wherein the first insulating film has a uniform thickness on sidewalls of the first plurality of solder bumps, the uniform thickness being measured from the sidewalls of the first plurality of solder bumps in a direction perpendicular to the sidewalls of the first plurality of solder bumps.

12. The device of claim 11, wherein the uniform thickness is from 500 Å to 20 µm.

13. The device of claim 8, further comprising:
a third device bonded to the first device through a second plurality of solder bumps;
a second insulating film extending along a surface of the first device from a third solder bump of the second plurality of solder bumps to a fourth solder bump of the second plurality of solder bumps, the second insulating film extending along a surface of the third device from the third solder bump to the fourth solder bump; and
a second underfill material between the first device and the third device, the second underfill material extending from the second insulating film on the third solder bump to second insulating film on the fourth solder bump.

14. A device comprising:
a substrate;
a first component having a first surface bonded to the substrate with a first set of conductive connectors;
a first insulating film disposed on the first set of conductive connectors, the first insulating film covering a surface of the substrate from a first conductive connector to a second conductive connector, the first insulating film covering the first surface of the first component from the first conductive connector to the second conductive connector, the first set of conductive connectors comprising the first conductive connector and the second conductive connector; and
a first thermally conductive underfill disposed between the substrate and the first surface of the first component, the first thermally conductive underfill surrounding the conductive connectors of the first set of conductive connectors and the first insulating film on the conductive connectors of the first set of conductive connectors, wherein the first thermally conductive underfill is completely separated from the surface of the substrate and the first surface of the first component by the first insulating film.

15. The device of claim 14, wherein the first set of conductive connectors comprises a solder material.

16. The device of claim 14, wherein the first thermally conductive underfill comprises a polymer.

17. The device of claim 14, wherein the first insulating film comprises aluminum oxide, hafnium oxide, silicon dioxide, titanium oxide, zirconium oxide, a polymer, or any combination thereof.

18. The device of claim 14, further comprising:
a second component having a first surface bonded to a second surface of the first component with a second set of conductive connectors;
a second insulating film disposed on the second set of conductive connectors, the second insulating film covering the second surface of the first component from a third conductive connector to a fourth conductive connector, the second insulating film covering the first surface of the second component from the third conductive connector to the fourth conductive connector, the second set of conductive connectors comprising the third conductive connector and the fourth conductive connector; and
a second thermally conductive underfill disposed between the first surface of the second component and the second surface of the first component, the second thermally conductive underfill surrounding the conductive connectors of the second set of conductive connectors and the second insulating film on the conductive connectors of the second set of conductive connectors.

19. The device of claim 18, wherein the first thermally conductive underfill has a thermal conductivity of at least 0.5 W/mK.

20. The device of claim 19, wherein the second thermally conductive underfill has a thermal conductivity of at least 0.5 W/mK.

* * * * *